United States Patent [19]

Keller et al.

[11] Patent Number: 4,734,651

[45] Date of Patent: * Mar. 29, 1988

[54] ELECTRICAL CONTINUITY AND SHORT CIRCUIT TESTING

[75] Inventors: Joseph R. Keller, Harrisburg; Michael D. Strong, Annville, both of Pa.

[73] Assignee: AMP Incorporated, Harrisburg, Pa.

[*] Notice: The portion of the term of this patent subsequent to Mar. 31, 2004 has been disclaimed.

[21] Appl. No.: 880,268

[22] Filed: Jun. 30, 1986

[51] Int. Cl.$^4$ ............................................. G01R 31/04
[52] U.S. Cl. .................................... 324/538; 324/66; 324/519; 324/DIG. 1
[58] Field of Search ............... 324/540, 539, 538, 519, 324/66, DIG. 1, 61 R; 379/25, 10, 12

[56] References Cited

U.S. PATENT DOCUMENTS

| | | | |
|---|---|---|---|
| 4,173,736 | 11/1979 | Adams | 324/51 |
| 4,254,495 | 3/1981 | Bollard | 379/25 X |
| 4,620,282 | 10/1986 | Shelley | 324/66 X |
| 4,654,580 | 3/1987 | Keller | 324/51 |

FOREIGN PATENT DOCUMENTS

WO86/00417  1/1986  PCT Int'l Appl. .

Primary Examiner—Reinhard J. Eisenzopf
Assistant Examiner—Robert W. Mueller
Attorney, Agent, or Firm—Thomas G. Terrell

[57] ABSTRACT

Electrical continuity between the terminals of a multi-contact electrical connector and the cores of insulated leads that have been connected thereto, is tested for by engaging a respective electrical test probe with each of the terminals and using a multiplexer to connect each test probe in turn to a continuity testing circuit, under the control of a computer. Following the continuity test, a bank of analog switches also controlled by the computer is used to apply short circuit test electrical potential to energize selected terminals, and the presence of the test potential on adjacent unenergized terminals is tested for by the computer, to detect short circuiting between the terminals.

9 Claims, 7 Drawing Figures

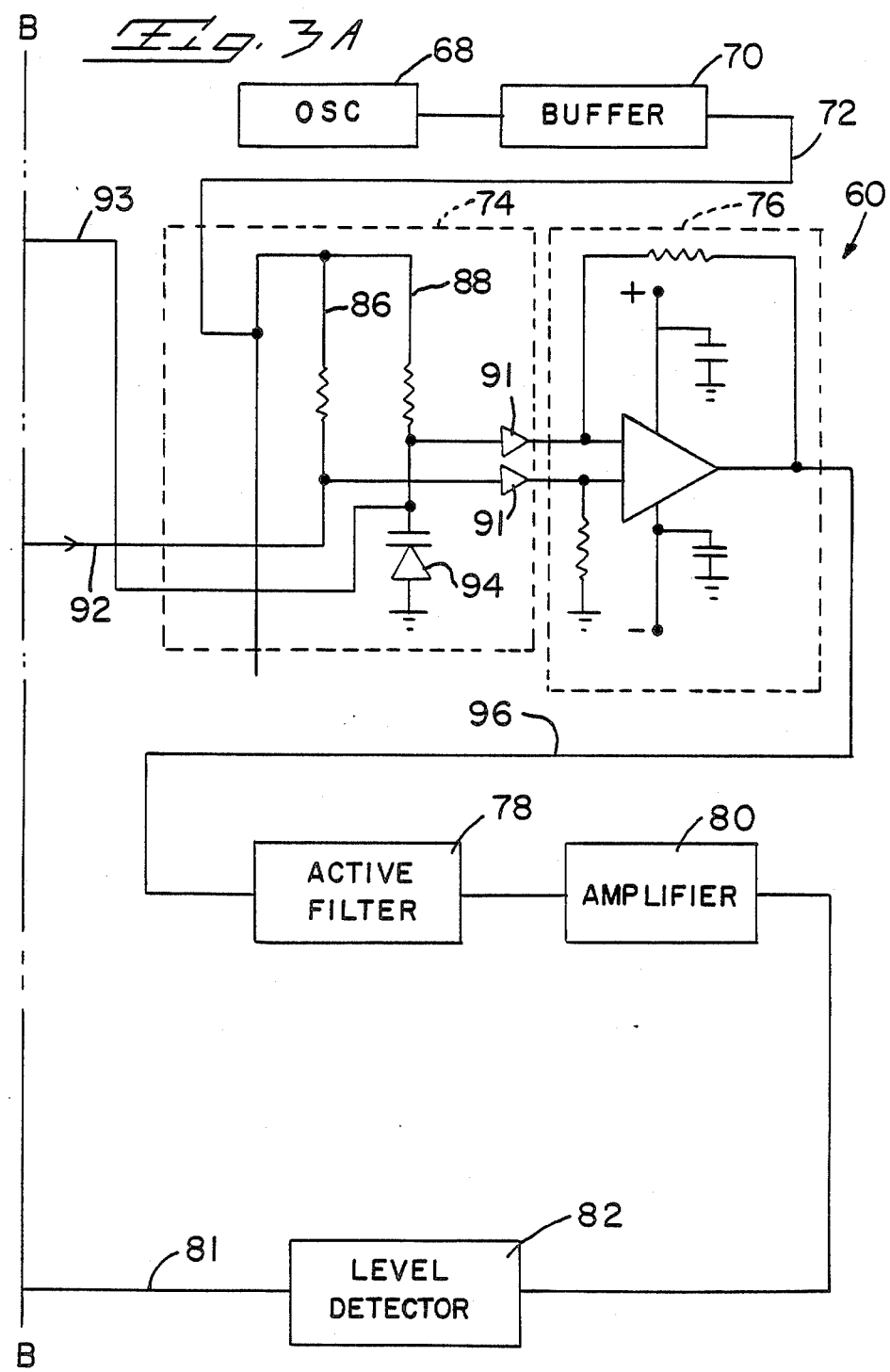

ELECTRICAL CONTINUITY AND SHORT CIRCUIT TESTING

This invention relates to apparatus for testing for electrical continuity between electrical terminals of a multicontact electrical connector and electrically conductive cores of electrical leads which have been connected to the terminals and for testing for short circuiting therebetween. The invention also relates to a method of carrying out such tests.

There is disclosed in WO-86/00417, published under the Patent Cooperation Treaty, a method of, and apparatus for, testing for electrical continuity between an electrical terminal and a metal core of an insulated lead. Although it is disclosed in WO-86/00417 that where the terminals of a multicontact electrical terminal are to be tested for continuity, only a single continuity test circuit need be provided if a multiplexer is employed to scan the terminals of the connector, no means are described in WO-86/00417 whereby this can be done, and no means are disclosed, for testing for short circuiting between the terminals.

Although a circuit is described in U.S. Pat. No. 4,173,736, for testing for continuity between the terminals of a multicontact electrical connector and the electrically conductive cores of leads connected to the terminals, such testing is disclosed as being carried out only with the aid of a reference electrical connector the terminals of which are connected to the other ends of the leads, and no means are described for testing for short circuiting between the terminals.

According to the present invention as stated in outline, a series of test probes are simultaneously brought into contact with respective terminals of the connector, a single continuity testing circuit being sequentially connected to the test probes, after which a short circuit test potential is applied to selected probes and the presence of that potential upon adjacent unenergized probes is detected.

No reference electrical connector is required for carrying out the continuity tests.

Where the leads are connected to the terminals by means of an applicator for this purpose, the applicator is stopped and an indication of the fault is displayed, in the event of the failure of any of the tests. Where the continuity testing circuit, comprises a bridge circuit feeding a differential amplifier, means are provided for balancing the arms of the bridge circuit prior to each continuity test, as the temperature of the applicator rises after start up, so that falsification of any of the continuity tests is avoided. An auxiliary capacitance may be provided in parallel with the capacitor which thereby acts only as a fine tuning device. Control potential may be applied to the variable capacitor by way of a digital to analog converter from a digital computer arranged to memorize the control voltage required to be applied to the variable capacitor in respect of each test probe. The short circuit test electrical potential may be applied to the test probes, under the control of the computer, by means of a bank of switches each being individual to one of the test probes, the switches being in a nonconductive condition when the continuity tests are being carried out.

For a better understanding of the present invention and to show how it may be carried into effect, reference will now be made by way of example to the accompanying drawings in which.

Figure 1:
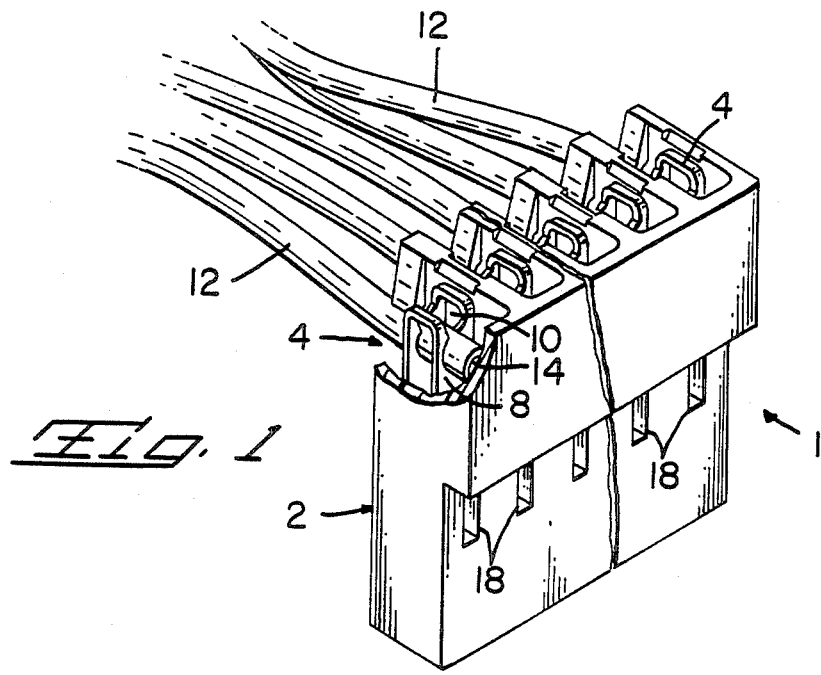
FIG. 1 is a perspective view of a multicontact electrical connector to terminals of which insulated leads have been connected.
Figure 2:
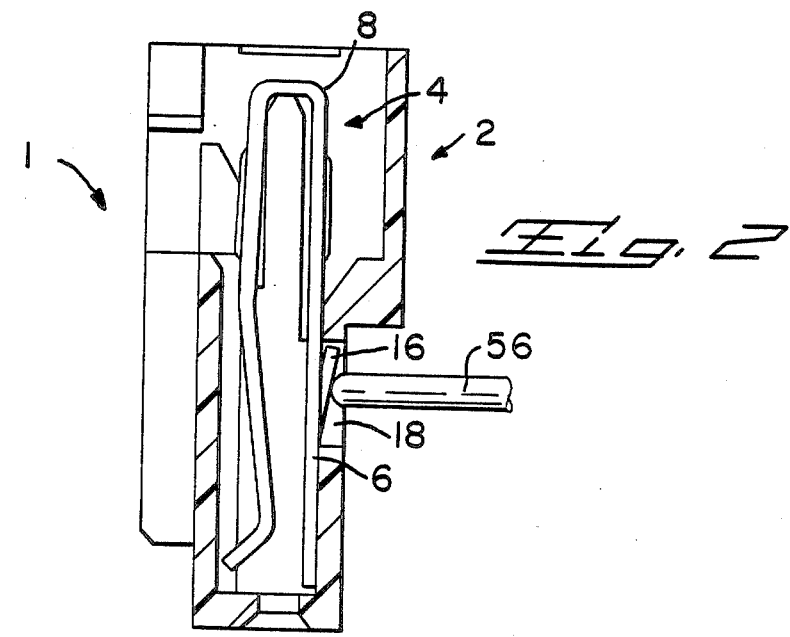
FIG. 2 is a cross-sectional view of the connector showing an electrical test probe in contact with one of the terminals of the connector, the leads not being shown.
Figure 3:
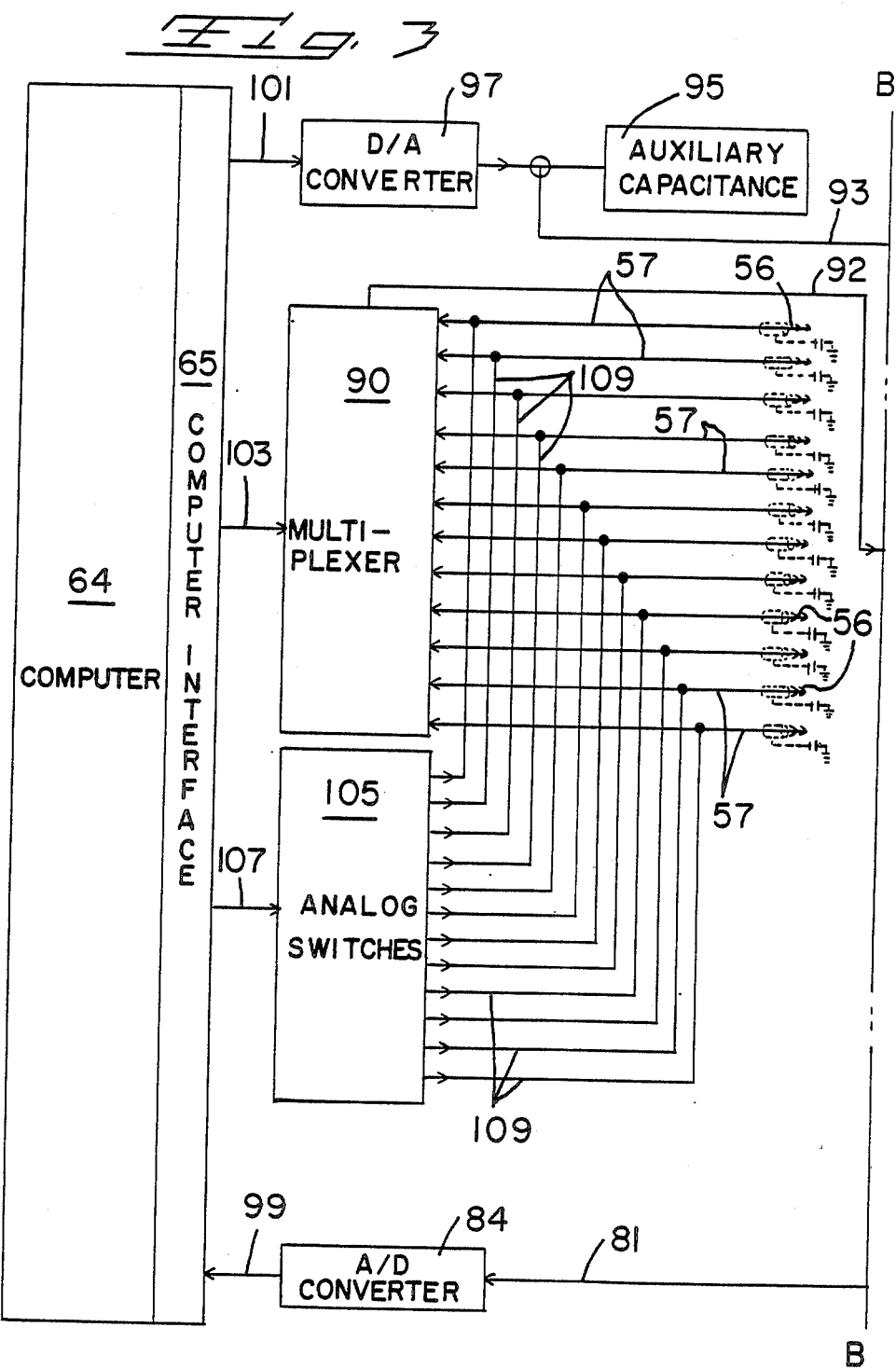
Figure 4:
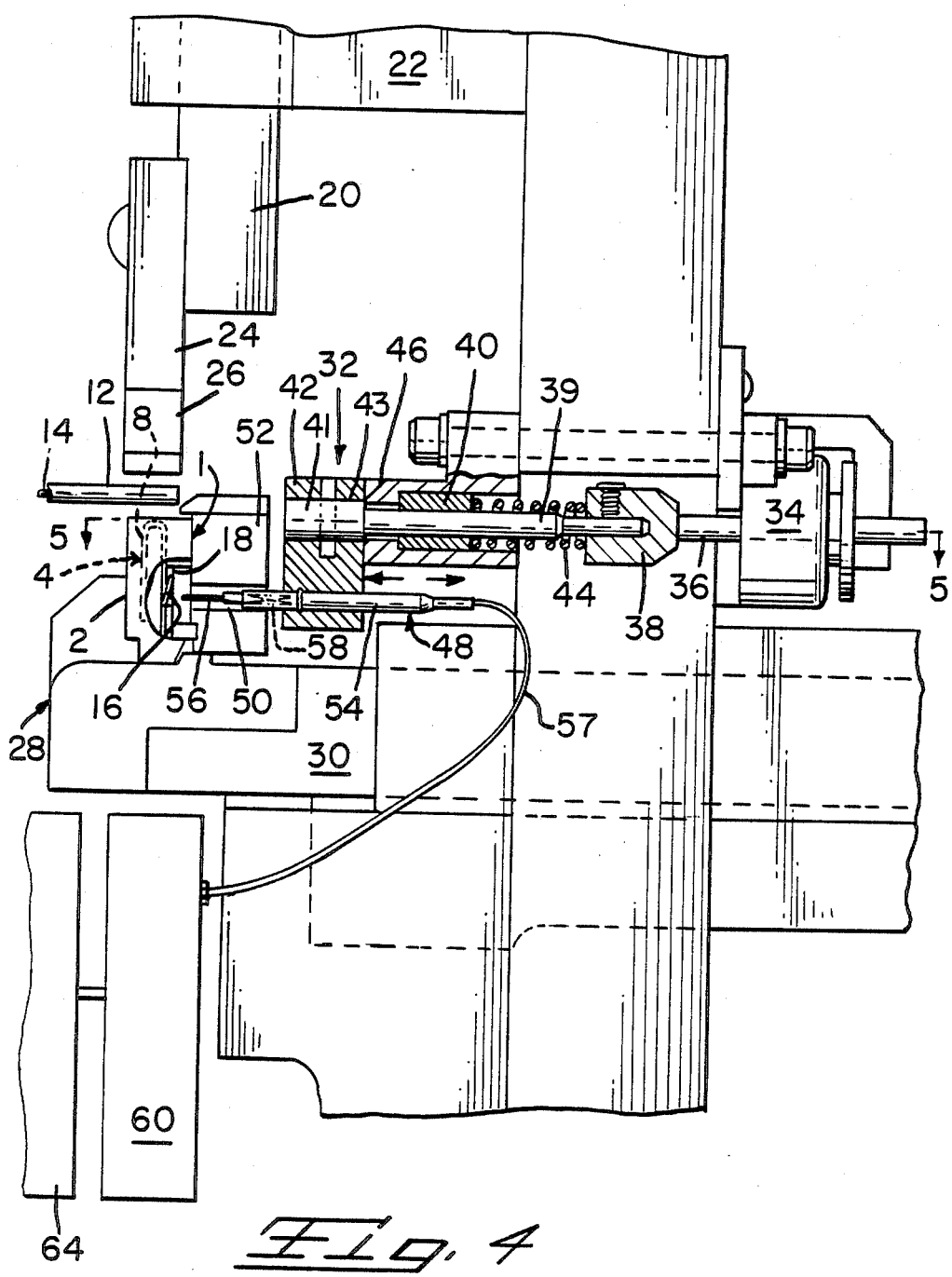
Figure 5:
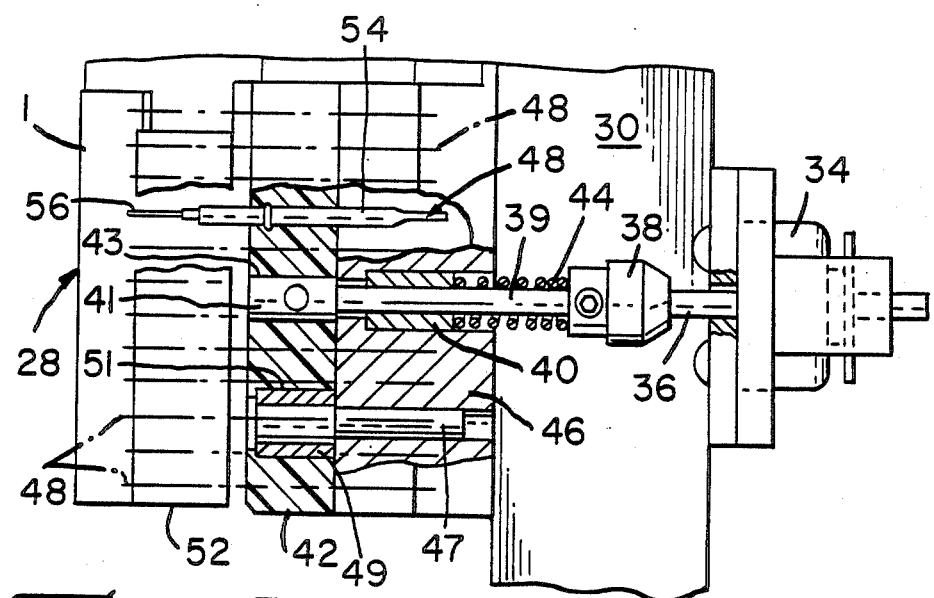

FIGS. 3 and 3A when put together on the lines B—B thereon cooperate to provide a diagram, shown partly in block schematic form, of a circuit assembly for testing for electrical continuity between the terminals and the metal cores of the leads, and for testing for the presence of short circuiting between the terminals;

FIG. 4 is a diagrammatic side view shown partly in section, of an applicator for electrically connecting insulated leads to the terminals of the connector of FIGS. 1 and 2 and being provided with said circuit assembly and with means for applying test probes to said terminals;

FIG. 5 is a view taken on the lines 5—5 of FIG. 4; and

Figure 6:
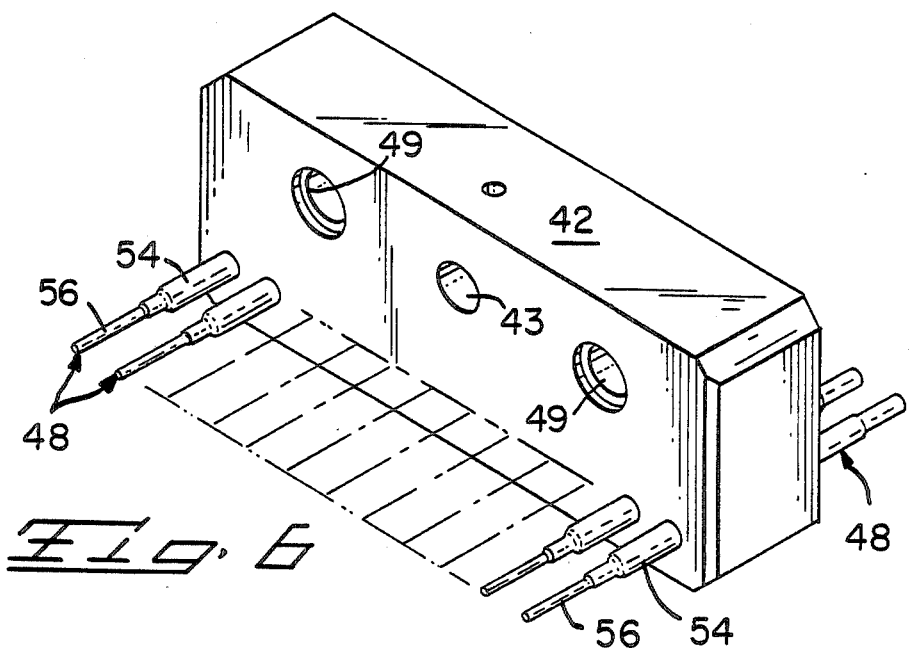

FIG. 6 is a perspective view of a detail of FIGS. 4 and 5.

The connector shown in FIGS. 1 and 2, comprises an insulating housing 2 containing, by way of example only, twelve electrical terminals 4, only a few of which are shown. Each terminal comprises a receptacle portion 6 and a wire connecting portion 8 having a wire slot 10 into which an insulated electrical lead 12 has been forced so that the edges of the slot 10 make firm electrically conductive contact with the metal core 14 of the lead 12. As shown in FIG. 2, the terminals 4 are retained in the housing 2 by means of locking tangs 16 on the terminals 4, which tangs project into windows 18 in the housing 2. Such a connector is described in detail in U.S. Pat. No. 4,159,158, which is incorporated herein by reference.

The applicator, which is shown in FIGS. 4 and 5, comprises a press ram 20 arranged to be driven in vertical reciprocating motion by means of a drive motor (not shown) and being slidably mounted in a press frame 22. On the ram 20 is a wire insertion tool 24 having twelve wire insertion fingers 26 spaced from one another longitudinally of a connector holder 28 on a base 30. The ram is arranged to be driven by the motor through a working stroke so that each finger 26 inserts a respective insulated lead 12 into the wire slot of a corresponding terminal 4 of a connector 1 on the connector holder 28, upon a start switch (not shown) being actuated by the operator. Mounted on the base 30, is a test probe assembly 32 comprising a solenoid 34 fixed to the base 30 and the armature 36 of which is connected by means of an adaptor 38 to a plunger 39 slidable in a bush 40 and being fixed at its end 41 remote from the adaptor 38, in a bore 43 in a test probe carrier block 42 (best seen in FIG. 6). A spring 44 acts between the adaptor 38 and the bush 40 to urge the plunger 39 in a rightward (as seen in FIG. 4) sense, so that the block 42 normally abuts a block 46 fixed to the base 30 and in which the bush 40 is secured against movement relative to the block 46. The block 42 is guided relative to the block 46 on rods 47 received in bushes 49 in bores 51 in the block 42 (FIG. 5). Twelve test probe units 48 extend through the lower (as seen in FIG. 4) part of the block 42 in fixed relationship thereto, each unit 48 projecting into a bore 50 in a connector guide block 52 fixed relative to the connector support 28, the bores 50 being so arranged that each is positioned opposite to a respective window 18 in the housing 2 of the connector 1 when it is operatively positioned upon the connector support 28. Each test probe unit 48 comprises a metal shielding tube 54 connected to the shield of a coaxial cable 57, and a test probe 56 coaxial with the tube 54 and being insulated therefrom. The probe 56 is connected to the central conductor of the cable 57 and is slidable axially of the tube 54, being movable thereinto against the action of a spring 58. When the fingers 26 have inserted the leads 12 into the wire slots of the terminals 8, and the ram 20 has been moved through its subsequent return stroke, the solenoid 34 advances its armature 36, under the control of a press control microprocessor (not shown) so that the block 32 is advanced towards the block 52 against the action of the spring 44. Each probe 56 is thereby moved axially into the corresponding window 18 in the connector housing 2, so as to engage the tang 16 therein and thus to make electrical contact with the corresponding terminal 4. The electrical continuity of the electrical connection between each terminal 4 and the core 14 of the corresponding lead 12 and the presence of short circuiting between the terminals 4 are thereby tested for through the agency of an electrical continuity and short circuit testing circuit assembly (FIGS. 3 and 3A) comprising a test unit 60 to which the cables 57 are connected a digital computer 64, and a computer interface 65 by way of which the unit 60 is connected to the computer 64. If as a result of the continuity testing programme, electrical continuity is found between each terminal 4 and the core 14 of its respective lead 12, and no short circuit between the terminals 4 is detected, the computer 64 signals the microprocessor to allow the applicator to remain in an active condition, but if there is no continuity between at least one of the terminals and the corresponding lead core 14, or a short circuit between terminals 4 has been detected, no activation signal is sent to the microprocessor which accordingly automatically deactivates the applicator, and displays the fault, as signaled to it by the computer 64.

A continuity, and a short circuit, test program is carried out in respect of each connector to which leads are connected by the applicator.

The unit 60 comprises, as shown in FIGS. 3 and 3A, an oscillatory circuit 68, connected through a buffer 70 and a line 72, to a two armed bridge circuit 74, which is in turn connected to the inlets of a differential amplifier 76 the outlet of which is connected, by a line 96, to a signal level detector 82, by way of an active filter 78 and an amplifier 80. The outlet of the signal level detector 82 is connected through a line 81 an analog to digital converter 84 and a line 99, to an inlet of the interface 65. The bridge circuit 74 comprises arms 86 and 88 connected to the line 72, the arm 88 being grounded through an electrically controlled varicap 94, which is a voltage variable capacitance diode. Between the outlets of the bridge circuit 74 and the inlets of the differential amplifier 76, are interposed impedance matching amplifiers 91. The twelve test probes 56 are connectable sequentially to the arm 86 and thus to the line 72 by way of a multiplexer 90 to which the arm 86 is connected by way of a line 92, the cable 57 of each probe 56 being connected to the multiplexer 90. The varicap 94 is connected via a line 93 to a balancing auxiliary capacitance 95 in parallel with the varicap 94, and to a digital to analog converter 97 which is in turn connected via a line 101 to an the interface 65.

Each switch of a bank 105 of twelve analog switches is connected via a line 109 to a respective one of the cables 57 and thus to a respective probe 56, and is connected via control lines 107 of a bank of such control lines to the interface 65.

The arrangement of the bridge circuit 74 is such that the oscillatory circuit 68 applies oscillatory signals of substantially identical form and value to the arms 86 and 88. The arm 86 is grounded via a capacitance provided by the shield of a respective cable 57 when it has been connected to the arm 86 by the multiplexer 90. The differential amplifier 76 is responsive to unbalanced input signals in the arms 86 and 88, to energize its outlet 96 and thus to emit a continuity success signal to the computer 64 by way of the filter 78, the amplifier 80, the signal level detector 82, the analog to digital converter 84, and the computer interface 65.

The oscillatory circuit 68, produces a continuous sinusoidal voltage at a frequency of 100 kilohertz at 3.5 volts, peak, which is delivered to the line 72 by the buffer 70. When a test probe 56 applied to the tang 16 of a corresponding terminal 4 has been connected to the line 92 by the multiplexer 90, and there is electrical continuity between the core 14 of the lead 12 connected to said terminal 4, a capacitance exists between the test probe 56 and ground. One plate of such capacitance is constituted by the core 14, which will, in practice, be several inches in length, and the terminal 4, and the other plate of such capacitance is constituted by the natural ground plane provided by the metal of the machine, or by the operator or by both. By virtue of the said capacitance, the oscillatory signal produced by the circuit 68 and which is in balance in the arms 86 and 88, is applied via ground to the arm 88 so that the oscillatory signal is changed in phase, and in amplitude. The signals in the arms 86 and 88 thereby become unbalanced, so that upon their being compared by the differential amplifier 76, the later energizes its outlet lead 96 so as to produce said success signal, which causes the computer 64 to signal the microprocessor, by means of said activation signal, that the applicator should remain active.

However, in the event that there is electrical discontinuity between the core 14 and the terminal 4, minimal capacitance exists between the test probe 56 and ground, so that the voltage in the arm 88 remains undisturbed, whereby the signals applied to the differential amplifier 76, remain in balance so that its outlet line 96 remains unenergized and so that the computer 64 automatically tells the microprocessor, by failure to emit the activation signal, to deactivate the applicator and also signals the microprocessor to display the discontinuity fault.

The signal level detector 82 establishes a success signal amplitude threshold which must be exceeded before a signal is applied to the converter 84 and is transmitted to the computer 64. The varicap 94 is employed to balance the capacitance of each coaxial cable 57 when it is connected to the line 92 thereby to keep the bridge circuit 74 in balance so as to ensure that false success signals are not transmitted to the computer 64. As the signal voltage of the arm 88 increases, the capacitance of the varicap 94 decreases and vice versa. The computer 64 looks for such changes in capacitance, memorizes these, and applies corrective potential to the line 93, between continuity tests to balance the arms 86 and 88. The computer 64 thus corrects the capacitance of the varicap 94 in respect of each individual cable 57 and maintains that capacitance up-dated, throughout each continuity testing program.

The varicap 94 is thus controlled so as to compensate for the slow drift in the capacitance of the cables 57, which occurs as the temperature of the applicator increases after start up.

Nevertheless, since the capacitance range of the varicap 94 is strictly limited, it can act only as a fine tuner in respect of the balance of the bridge circuit 74. The auxiliary capacitance 95 is accordingly provided as a coarse balancing device. The capacitance 95 may comprise a bank of individual capacitors which can be switched in, manually, in parallel with the varicap 94. The capacitance 95 is, however, preferably in the form of a dummy coaxial line, similar to a cable 57 and being of a capacitance which approximates to that of a cable 57. The auxiliary capacitance 95 is adjusted when the applicator is being set up.

The mutliplexer 90 scans, sequentially, all the cables 57 in accordance with the program of the computer 64 when the armature 36 of the solenoid 34 is in its advanced position so that each probe 56 is in contact with a terminal 4. In the course of each scan of the multiplexer 90, each probe 56, in turn, is connected to the bridge circuit 74 so that the computer 64 receives either a success signal, or no signal, (that is to say a discontinuity indication), as the case may be in respect of each terminal. During the said scanning, and in accordance with the program of the computer 64, the switches of the bank 105 are maintained in a nonconductive condition but following each scan of the multiplexer 90 that is to say following each continuity testing program, switches of the bank 105 are simultaneously and selectively rendered conductive by the computer 64 via respective lines 107, according to the computer program, thereby to energize with short circuit test DC potential via the lines 109, selected groups of cables 57. As explained below, the number of simultaneous activations of selected switches of the bank 105, that will be required, will depend upon the number of terminals in the connector. In the event that there is a short circuit between two terminals 4, the test potential will, nevertheless, exist on that terminal which is unactivated, that is to say to which test potential was not applied. The multiplexer 90 sequentially connects the unenergized lines 109 to the line 92 and if there is DC potential on one of these lines, the bridge circuit 74 will become unbalanced and said unbalance will be detected by the computer 64 via the line 81. The computer accordingly transmits no activation signal to the microprocessor and instructs it to indicate the sort circuited terminal.

The connector to be tested may have any convenient number of terminals, for example thirty two terminals, the test probes, and switches in the bank 105, being also of the same number.

In order to determine whether two terminals have been short circuited, it is necessary for the switch bank 105 to apply the test potential to one of them, i.e., to the appropriate cable 56, and to determine whether such potential is present on the other.

If there are two additional terminals, short circuiting between these can be determined in the same way as for the first two, it being only necessary to test for short circuits between terminals of one pair to terminals of the other pair, which can be achieved by energizing both the terminals of one pair and not the remaining terminals, so that two tests are needed and these may be symbolized as follows, "1" representing a terminal to which the test potential has been applied and "0" representing a terminal to which the test potential has not been applied:

| Number of Terminals | 1 | 2 | 3 | 4 |
|---|---|---|---|---|
| Test 1 | 1 | 0 | 1 | 0 |
| Test 2 | 1 | 1 | 0 | 0 |

It will be apparent from the above, that doubling the number of terminals requires the addition of one test in which the one half of the cables 57 are all energized with test potential and the other half are not energized. Thus, if n is a power of 2, the required test for n wires can be symbolized as follows:

| Number of Terminals | 1 | 2 | 3 | 4 | 5 | n-1 | n |
|---|---|---|---|---|---|---|---|
| Test 1 | 1 | 0 | 1 | 0 | 1 | 1 | 0 |
| Test 2 | 1 | 1 | 0 | 0 | 1 | 0 | 0 |
| Test 3 | 1 | 1 | 1 | 1 | 0 | 0 | 0 |
| Test $\log_2 n$ | 1 | 1 | 1 | 1 | 1 | 0 | 0 |

Thus $\log_2 n$ patterns of 1s and 0s are required for n terminals and for each pattern all the 0 terminals, that is to say the unenergized terminals, must be examined by the computer 64 to ensure that they are not infact energized as the result of a short circuit. Thus in respect of each pattern, n/2 terminals must be examined for potential. Accordingly, the number of examinations for non-energization required to test for short circuits amongst n terminals, where n is a power of 2, is: $(n/2) \log 2n$ thus, for example in order to test 32 terminals eighty terminals would need to be examined for non-energization.

The short circuit test procedure described above, will also, of course, reveal whether any of the leads 12 are short circuited amongst themselves.

The computer 64 may be arranged to perform the functions of the said microprocessor, the microprocessor being accordingly omitted.

We claim:

1. Apparatus for testing for electrical continuity between electrical terminals of a multicontact electrical connector and electrically conductive cores of electrical leads which have been connected to the terminals and for testing for short circuiting therebetween, the apparatus comprising:

a frame;

a connector support on the frame;

a plurality of test probes on the frame;

means for simultaneously electrically connecting the test probes, each to a respective terminal of the connector when it is supported by the connector support;

an electrical continuity test circuit means connectible to each test probe, for producing a continuity success signal where electrical continuity exists between a terminal connected to the test probe by said connecting means and the electrically conductive core of a lead connected to the terminal;

a multiplexer for connecting said test circuit means to each test probe in turn when the test probes have been connected to said terminals by said connecting means, to enable said test circuit means to carry out a continuity test program;

a source of short circuit test electrical potential;

switch means connected to said source and to each of the test probes, for simultaneously transmitting said potential to selected first ones of said test probes, upon completion of said continuity test program; and short circuit detecting means responsive to the presence of said test potential on second ones of said test probes, to indicate the presence of a short circuit, wherein said continuity test circuit means comprises an oscillatory circuit, a bridge circuit, a signal comparator responsive to unbalanced inputs from the bridge circuit, and means for emitting said continuity success signal, the oscillatory circuit having an outlet connected to inlets of the bridge circuit and therby to said multiplexer, outlets of the bridge circuit being connected to respective inlets of the signal comparator an outlet of which is connected to said emitting means; an arm of the bridge circuit being grounded through an electrically controlled voltage sensitive variable capacitor connected to a source of control potential for causing said capacitor to balance said bridge circuit prior to the connection of the continuity test circuit means to each test probe.

2. Apparatus as claimed in claim 1, wherein said capacitor is connected through a digital to analog converter to a digital computer for applying said control potential to said capacitor.

3. Apparatus as claimed in claim 1, wherein a balancing auxiliary capacitance in the form of a coaxial cable is connected in parallel with said variable capacitor.

4. Apparatus as claimed in claim 1, wherein each test probe is connected to the multiplexer by way of a respective first coaxial cable, an auxiliary capacitance consisting of a second coaxial cable of similar capacity to said first coaxial cables, being connected in parallel with said variable capacitor.

5. Apparatus for testing for electrical continuity between electrical terminals of a multicontact electrical connector and electrically conductive cores of electrical leads which have been connected to the terminals and for testing for short circuiting therebetween, the apparatus comprising:
a plurality of test probes,
an oscillatory circuit,
a two arm bridge circuit,
a differential amplifier,
electrical continuity indicating means,
a multiplexer, and
a plurality of analog switches,
the oscillatory circuit having an outlet connected to both arms of the bridge circuit, each arm of which is connected to a respective inlet of the differential amplifier, and the differential amplifier having an outlet connected to the indicating means, each arm of the bridge circuit being grounded through a capacitance, and the differential amplifier being sensitive to the application of unbalanced inputs to the inlets thereof, so as to actuate said indicating means, said multiplexer being arranged to connect each test probe in turn, to an arm of said bridge circuit and said analog switches being arranged thereafter to apply a short circuit test potential to selected first ones of said test probes simultaneously, means being provided for detecting the presence of said potential on second ones of said test probes adjacent to said first ones and for generating a short circuit indicating signal in response thereto.

6. Apparatus as claimed in claim 5, wherein one of said capacitances is in the form of an electrically controlled voltage sensitive diode capacitor and means are provided for applying a control potential to said capacitor to balance the arms of said bridge circuit prior to each test probe being connected to said arm of the bridge circuit.

7. Apparatus as claimed in claim 6, wherein each test probe is connected to said multiplexer through a coaxial cable, said cables being of substantially similar capacitance and a further coaxial cable which is of substantially similar capacitance to those connecting the test probes to the multiplexer, being connected in parallel with said variable capacitor.

8. Apparatus as claimed in claim 6, wherein said control potential is applied to said variable capacitor by way of a digital to analog converter from a digital computer arranged to memorize the control voltage required to be applied to the variable capacitor in respect of each test probe.

9. A method of testing for electrical continuity between electrical terminals of a multicontact electrical connector and electrically conductive cores of electrical leads which have been connected to the terminals, and of testing for short circuiting therebetween, the method comprising the steps of:
simultaneously electrically connecting a plurality of test probes, each with a respective terminal of the connector;
connecting an electrical continuity test circuit to each test probe in turn to test the continuity of the electrical connection between each terminal and the core of the electrical lead connected thereto;
producing a continuity test success signal in respect of each successful continuity test;
applying a short circuit test potential to one of two terminals;
detecting the presence of said potential on the other of the two terminals; and
producing a short circuit indicating signal in response thereto, and in which method substantially identical oscillatory signals are simultaneously delivered to each terminal in turn and to the arms of a two armed bridge circuit coupled to signal comparison means responsive to signal imbalance in said arms, the arms of the bridge circuit being grounded and there being a ground plane in the vicinity of the lead connected to each terminal, whereby if there is electrical continuity between the terminal and the core of that lead, the capacitance between the core and the ground plane causes imbalance between the signals in the bridge arms, so that unbalanced signal inputs are applied by the bridge circuit to the signal comparison means to cause the latter to emit an electrical success signal, the method comprising the further step of balancing said arms following each continuity test by means of an electrically controlled variable capacitor, the capacitance of which decreases as the voltage thereacross rises.

* * * * *